United States Patent
Yang et al.

(10) Patent No.: US 12,395,782 B2
(45) Date of Patent: Aug. 19, 2025

(54) ELECTRONIC DEVICE AND METHOD FOR OUTPUTTING SOUND

(71) Applicant: SAMSUNG ELECTRONICS CO., LTD., Suwon-si (KR)

(72) Inventors: Jaemo Yang, Suwon-si (KR); Seonmi Kim, Suwon-si (KR); Geeyeun Kim, Suwon-si (KR); Hangil Moon, Suwon-si (KR); Kyoungho Bang, Suwon-si (KR); Jaeseong Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 211 days.

(21) Appl. No.: 18/116,715

(22) Filed: Mar. 2, 2023

(65) Prior Publication Data

US 2023/0283944 A1     Sep. 7, 2023

Related U.S. Application Data

(63) Continuation of application No. PCT/KR2023/002877, filed on Mar. 2, 2023.

(30) Foreign Application Priority Data

Mar. 2, 2022  (KR) .................. 10-2022-0026553
May 6, 2022  (KR) .................. 10-2022-0056170

(51) Int. Cl.
*H04R 3/00*      (2006.01)
*H03L 7/02*      (2006.01)
(Continued)

(52) U.S. Cl.
CPC ............. *H04R 1/24* (2013.01); *H03L 7/02* (2013.01); *H04R 1/222* (2013.01); *H04R 3/005* (2013.01); *H04R 3/04* (2013.01)

(58) Field of Classification Search
None
See application file for complete search history.

(56) References Cited

U.S. PATENT DOCUMENTS 10,951,990 B2     3/2021   Nawfal et al.
2009/0141907 A1   6/2009   Kim et al.
(Continued)

FOREIGN PATENT DOCUMENTS

EP           3745399 A1 * 12/2020  ............... G06N 3/04
JP        2016048872 A      4/2016
(Continued)

OTHER PUBLICATIONS

International Search Report and corresponding Application No. PCT/KR2023/002877; Dated Jun. 2, 2023.

*Primary Examiner* — James K Mooney
(74) *Attorney, Agent, or Firm* — CANTOR COLBURN LLP

(57) ABSTRACT

Electronic devices and methods of use include a plurality of microphones, a speaker, an audio module, and a processor electrically coupled to the plurality of microphones, the speaker, and the audio module. The processor may be configured to control the audio module to separate each of input signals of ambient sounds input respectively through the plurality of microphones into a plurality of frequency bands by frequency conversion, control the audio module to obtain a gain value for each of the plurality of frequency bands based on an inter-channel phase variance for the plurality of frequency bands, control the audio module to filter a first frequency band signal with a directionality based on the gain value for each of the plurality of frequency bands, and control the speaker to output an output signal processed based on the first frequency band signal.

20 Claims, 11 Drawing Sheets

(51) Int. Cl.
  *H04R 1/22*   (2006.01)
  *H04R 1/24*   (2006.01)
  *H04R 3/04*   (2006.01)

(56) References Cited

U.S. PATENT DOCUMENTS

| | | |
|---|---|---|
| 2012/0163624 A1 | 6/2012 | Hyun |
| 2012/0308025 A1 | 12/2012 | Hendrix et al. |
| 2015/0226831 A1 | 8/2015 | Nakamura et al. |
| 2015/0379992 A1 | 12/2015 | Lee et al. |
| 2018/0192179 A1 | 7/2018 | Liu et al. |
| 2018/0206025 A1 | 7/2018 | Rule et al. |
| 2018/0255391 A1 | 9/2018 | Cambrell et al. |
| 2019/0058952 A1 | 2/2019 | Nawfal et al. |
| 2019/0222927 A1 | 7/2019 | Matsuo |
| 2019/0335273 A1 | 10/2019 | Kato et al. |
| 2020/0260187 A1 | 8/2020 | Poornachandran et al. |
| 2020/0380945 A1 | 12/2020 | Woodruff et al. |
| 2020/0382859 A1 | 12/2020 | Woodruff et al. |
| 2021/0174819 A1 | 6/2021 | Baek et al. |

FOREIGN PATENT DOCUMENTS

| | | |
|---|---|---|
| KR | 20140035414 A | 3/2014 |
| KR | 20160001964 A | 1/2016 |
| KR | 20190097391 A | 8/2019 |
| KR | 102350487 B1 | 1/2022 |

\* cited by examiner

ELECTRONIC DEVICE AND METHOD FOR OUTPUTTING SOUND

CROSS-REFERENCE TO RELATED APPLICATION(S)

This application is a continuation application, claiming priority under § 365(c), of International Application No. PCT/KR2023/002877, filed on Mar. 2, 2023, which is based on and claims the benefit of Korean patent application number 10-2022-0056170 filed on May 6, 2022, in the Korean Intellectual Property Office and of Korean patent application number 10-2022-0026553 filed on Mar. 2, 2022, in the Korean Intellectual Property Office, the disclosures of which are incorporated by reference herein in their entireties.

TECHNICAL FIELD

The disclosure relates to an electronic device and method for receiving an ambient sound generated in an external ambient environment and selectively outputting a sound by controlling the received ambient sound.

BACKGROUND ART

Along with the development of digital technology, electronic devices have been provided in various forms such as a smartphone, a tablet personal computer (PC), or a personal digital assistant (PDA). Electronic devices have also been developed into forms wearable on a user to improve portability and user accessibility.

Such an electronic device may be an ear-wearable device including a single or pair of (or both) earphones (e.g., earbuds) or a headphone wearable on both ears of the user, respectively. The ear-wearable device may be connected to an external electronic device (e.g., a portable terminal) and transmit voice data to the external electronic device, and the external electronic device may transmit audio data (or audio content) to the ear-wearable device. The ear-wearable device may output the audio data (or audio content) received from the external electronic device through a speaker.

The ear-wearable device may share data with low power by Bluetooth communication. External wireless communication devices may be connected to each other, using the Bluetooth technology. Wireless earphones using the Bluetooth communication technology have been widely used in recent years. In addition, to improve the performance of wireless earphones, wireless earphones including a plurality of microphones are widely used.

DISCLOSURE

Technical Problem

Earphones may provide various functions. For example, each earphone may include a microphone to detect a user's voice and thus transmit data of the user's voice to an external electronic device (e.g., a portable terminal).

An ear-wearable device may be, for example, a true wireless stereo (TWS) headset of a closed type or a canal type. Earphones forming the TWS headset may be connected to each other by wireless communication, and with a microphone in one of a pair of earbuds used as a main microphone, and data of a user's voice detected through the main microphone may be transmitted to an external electronic device (e.g., a portable terminal).

However, the ear-wearable device of the closed-type or canal-type headset physically blocks the user from an ambient sound generated in an external environment, making it difficult for the user to recognize the ambient sound, and does not provide intelligent active noise cancellation (ANC)/ambient sound to the user, thereby exposing the user to a danger. The ear-wearable device may only provide a function change by a user operation. The existing ear-wearable device is capable of only beamforming in a fixed direction (e.g., forward), and causes a delay for beamforming filtering processing. Accordingly, the user may have difficulty in recognizing an ambient sound around the user in real time.

Technical Solution

According to an embodiment of the disclosure, an electronic device and method for receiving an ambient sound generated in an external ambient environment, and selectively outputting sound by controlling the received ambient sound may be provided.

However, the objects to be achieved by the disclosure are not limited to what has been described above, and may be extended in various manners without departing from the spirit and scope of the disclosure.

According to an embodiment of the disclosure, an electronic device may include a plurality of microphones, a speaker, an audio module, and a processor electrically coupled to the plurality of microphones, the speaker, and the audio module. The processor may be configured to control the audio module to separate each of input signals of ambient sounds input respectively through the plurality of microphones into a plurality of frequency bands by frequency conversion, control the audio module to obtain a gain value for each of the plurality of frequency bands based on an inter-channel phase variance for the plurality of frequency bands, control the audio module to filter a first frequency band signal with a directionality based on the gain value for each of the plurality of frequency bands, and control the speaker to output an output signal processed based on the first frequency band signal.

According to an embodiment, a method of operating an electronic device may include receiving input signals of ambient sounds input respectively through a plurality of microphones of the electronic device, separating each of the input signals into a plurality of frequency bands by frequency conversion by an audio module of the electronic device, obtaining a gain value for each of the plurality of frequency bands based on an inter-channel phase variance for the plurality of frequency bands by the audio module, filtering a first frequency band signal with a directionality based on the gain value for each of the plurality of frequency bands by the audio module, and outputting an output signal processed based on the first frequency band signal through a speaker of the electronic device.

Advantageous Effects

According to an embodiment, as an ambient sound input through a plurality of microphones is controlled, a user who is blocked from the ambient sound may immediately hear an ambient sound with a directionality such as an ambient warning sound, a sound calling the user, or an announcement, without delay. Therefore, the user may immediately recognize a dangerous situation.

Further, according to an embodiment, because an electronic device may provide a selective listening function for sounds with a directionality as well as signal amplification of an ambient sound listening function, the electronic device may prevent disconnection from an ambient sound environment, while listening to a sound into which data received from an external electronic device is converted by blocking an ambient sound.

In addition, various effects directly or indirectly identified through this document may be provided.

DESCRIPTION OF THE DRAWINGS

In relation to the description of the drawings, the same or similar reference numerals may be used to denote the same or similar components.

MODE FOR INVENTION

An electronic device according to various embodiments will be described below with reference to the attached drawings. The term "user" as used in various embodiments may refer to a person using an electronic device or a device using an electronic device (e.g., an artificial intelligence electronic device).

Figure 1:
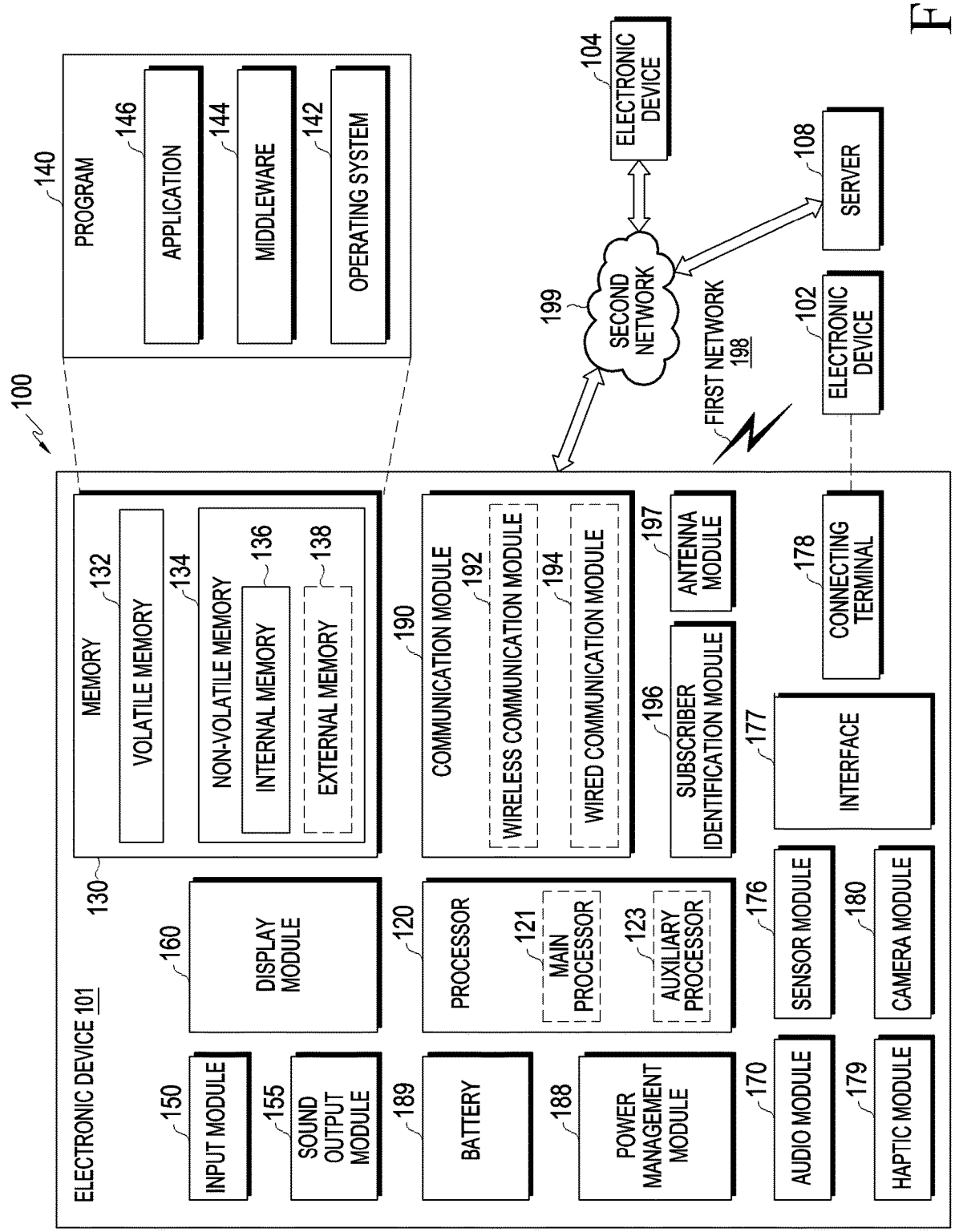
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form an mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
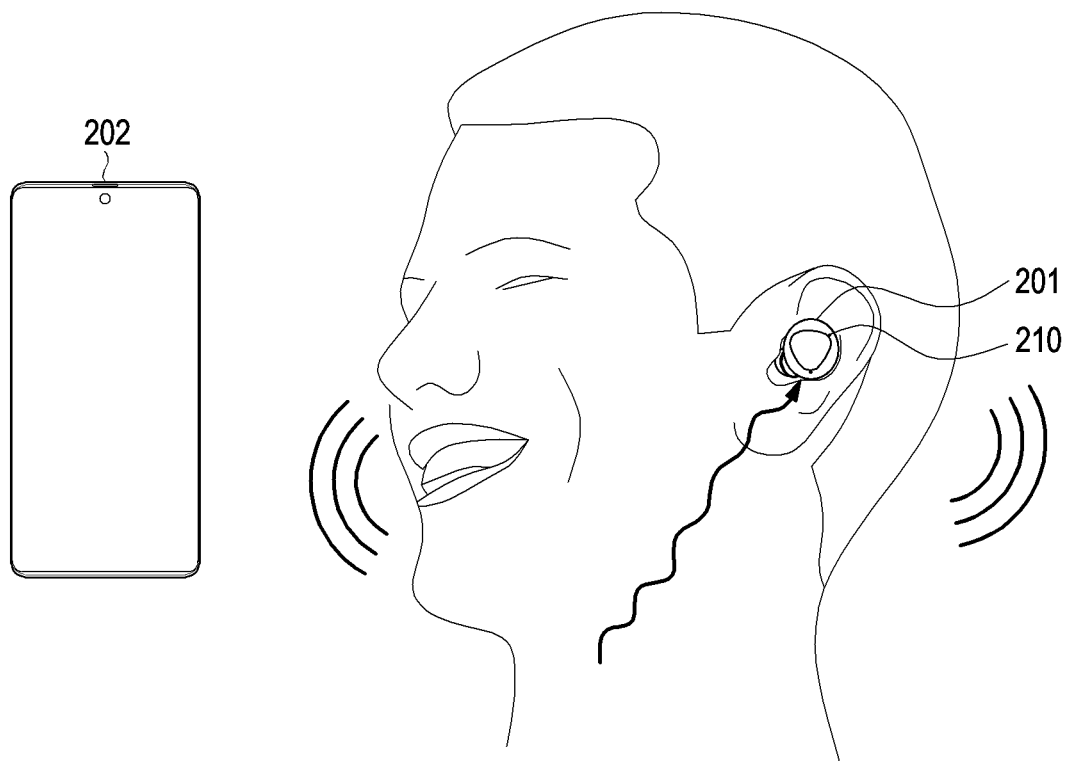
FIGS. 2A and 2B are diagrams illustrating a configuration of an electronic device for outputting a sound according to an embodiment.
Figure 2B:
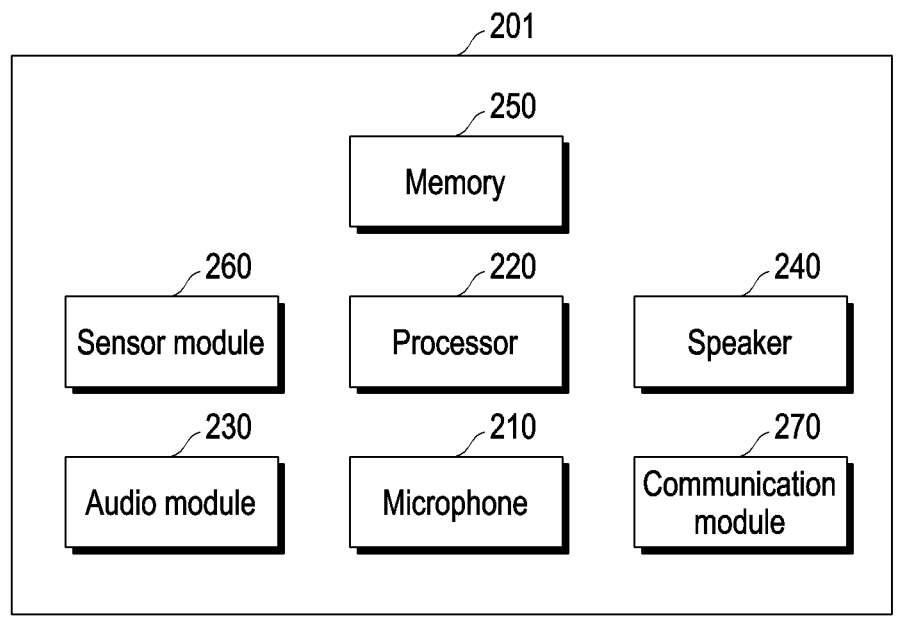

FIGS. 2A and 2B are diagrams illustrating a configuration of an electronic device for outputting a sound according to an embodiment.

Referring to FIGS. 2A and 2B, an electronic device 201 (e.g., the electronic device 101 of FIG. 1) according to an embodiment may be an ear-wearable device implemented as a pair of (or two) earphones (e.g., earbuds) or a headphone, or may be implemented as a single earphone or earbud (i.e., single ear use). The electronic device 201 may establish a communication link (e.g., a communication link using Bluetooth communication technology) with an external electronic device 202 (e.g., the electronic device 101, 102 or 104 of FIG. 1). The electronic device 201 may transmit and receive data related to a sound to and from the external electronic device 202 via the communication link. For example, the external electronic device 202 may be implemented as a smartphone. While for convenience of description, the configuration of one earphone of a pair of earphones is described as that of the electronic device 201 herein, the technical features of the electronic device 201 are also equally applicable to the other of the pair of earphones.

According to an embodiment, the electronic device 201 may include a plurality of microphones 210 (e.g., the input module 150 of FIG. 1), a processor 220 (e.g., the processor 120 of FIG. 1), an audio module 230 (e.g., the audio module 170 of FIG. 1), a speaker 240 (e.g., the sound output module 155 of FIG. 1), memory 250 (e.g., the memory 130), a sensor module 260 (e.g., the sensor module 176 of FIG. 1), and a communication module 270 (e.g., the communication module 190 of FIG. 1). According to an embodiment, the electronic device 201 may convert data received from the external electronic device 202 into a sound and output the converted sound (e.g., audio, music, a notification sound, or a call ring sound) through the speaker 240. When outputting the sound into which the data received from the external electronic device 202 is converted, the electronic device 201 may block a user from an ambient sound so that the user may listen to the sound in a quiet state. In a state in which the electronic device 201 is configured to output a sound into which data received from the external electronic device 202 is converted, while blocking an ambient sound, the electronic device 201 may receive ambient sounds (e.g., voice, a danger warning sound, or an announcement) generated in an external environment of the user through the microphones 210, and selectively output an ambient sound with a directionality through the speaker 240 in real time by controlling the received ambient sounds. The electronic device 201 may transmit data corresponding to the ambient sound to the external electronic device 202.

According to an embodiment, the plurality of microphones 210 of the electronic device 201 may include a first microphone 210a, a second microphone 210b, and a third microphone 210c. The first microphone 210a and the second microphone 210b may be microphones which are connected to an outer hole (e.g., outside the ear) of each of the earphones of the electronic device 201 while being worn on or in the user's ear to receive an external audio signal generated in an external ambient environment. Among the plurality of microphones 210, the third microphone 210c may be a microphone connected to an inner hole (e.g., inside the ear) while being worn on or in the user's ear. Although the electronic device 201 is shown as including three microphones 210 (210a, 210b, and 210c), the technical spirit of the disclosure may not be limited thereto. For example fewer than three or more than three microphones may be implemented in electronic devices in accordance with embodiments of the present disclosure.

According to an embodiment, the processor 220 of the electronic device 201 may provide overall control to the operations of the electronic device 201. The processor 220 may be implemented in the same manner as or a similar manner to the processor 120 of FIG. 1. The processor 220 may obtain a voice signal uttered by the user, received through the microphone 210 and/or an ambient sound generated in the external environment.

According to an embodiment, the processor 220 of the electronic device 201 may control the audio module 230 to process external audio signals input through the first microphone 210a and the second microphone 210b. The processor 220 may control the audio module 230 to frequency-convert the input signals received from the first microphone 210a and the second microphone 210b, respectively, and separate each of the frequency-converted signals into a plurality of frequency bands. The processor 220 may control the audio module 230 to obtain a gain value for each of the separate frequency bands based on an inter-channel phase variance (IPV) of the frequency band and perform multi-band filtering based on the gain values of the respective frequency bands. The processor 220 may identify a first frequency band signal with a directionality and a second frequency band signal without a directionality filtered on a frequency band basis through the multi-band filtering performed by the audio module 230. The processor 220 may control the speaker 240 to output an output signal processed based on the first frequency band signal filtered by the audio module 230. The first frequency band signal may be an ambient sound (e.g., voice, a danger warning sound, or an announcement) selectively output so that the user may hear it in real time.

According to an embodiment, the processor 220 may control at least one other component (e.g., a hardware or software component) of the electronic device 201 connected to the processor 220, and perform various data processes or operations. According to an embodiment, as at least part of a data process or operation, the processor 220 may store a command or data received from another component (e.g., the sensor module 260 or the communication module 270) in the memory 250, process a command or data stored in the memory 250, and store result data in the memory 250.

According to an embodiment, the audio module 230 may obtain a gain value based on an inter-channel phase variance for each of the plurality of frequency bands into which the input signals are separated by frequency conversion, filters a frequency band signal of each of the plurality of frequency bands based on the gain value obtained for the frequency band, and output an output signal processed based on the filtered frequency band signals through the speaker 240, so that the user may listen to them in real time.

According to an embodiment, the memory 250 may store information related to an operation of the electronic device 201, data of a voice or an ambient sound input through the microphones 210, and voice data received from the external electronic device 202.

According to an embodiment, the sensor module 260 may include at least one sensor (e.g., a vibration sensor) for detecting a signal related to the user's voice or an ambient sound.

According to an embodiment, the communication module 270 may be configured to perform a wireless communication function between the electronic device 201 and the communication module (e.g., the communication module 190 of FIG. 1) of the external electronic device 202 (e.g., the electronic device 101, 102 or 104 of FIG. 1). The communication module 270 may transmit data of a voice input from the electronic device 201 or an ambient sound to the external electronic device 202, using a short-range communication scheme. For example, the short-range communication scheme may include at least one of Bluetooth, Bluetooth low energy (BLE), infrared data association (IrDA), and wireless local area network (WLAN).

Figure 3:
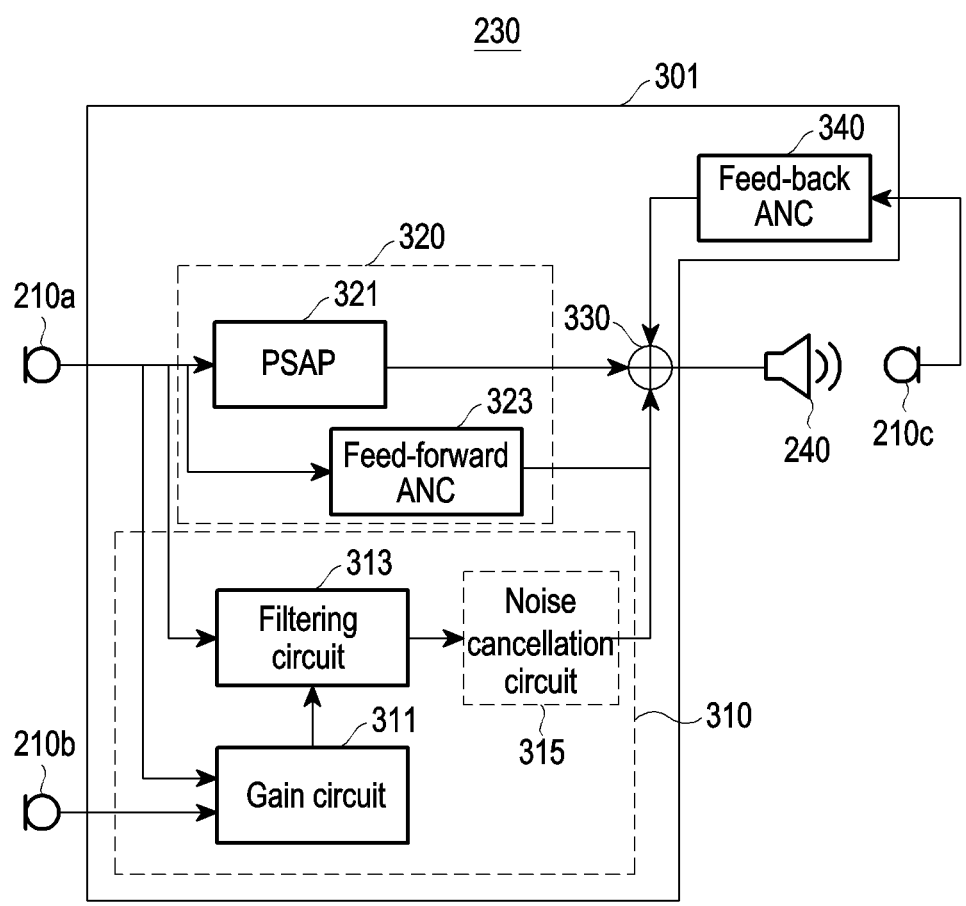
FIG. 3 is a block diagram illustrating a configuration of an audio module in an electronic device for outputting a sound according to an embodiment.

FIG. 3 is a block diagram illustrating a configuration of an audio module in an electronic device for outputting a sound according to an embodiment.

Referring to FIGS. 2A, 2B, and 3, the audio module 230 of the electronic device 201 according to an embodiment may include an audio signal processing circuit 301. As illustrated in FIG. 3, the audio signal processing circuit 301 may include a first signal processing circuit 310, a second signal processing circuit 320, and a synthesizer 330. The audio signal processing circuit 301 may further include a feed-back active noise cancellation (ANC) circuit 340 for noise cancellation, connected between the third microphone 210c and the synthesizer 330.

According to an embodiment, the first signal processing circuit 310 may have an input terminal connected to the first microphone 210a and the second microphone 210b and an output terminal connected to the synthesizer 330. The first signal processing circuit 310 may include a gain circuit 311 and a filtering circuit 313. The first signal processing circuit 310 may further include a noise cancellation circuit 315 for canceling noise in a frequency band signal output from the filtering circuit 313.

According to an embodiment, the second signal processing circuit 320 may be disposed between the first microphone 210a and the synthesizer 330, and include an amplification circuit (personal sound amplification product (PSAP)) 321, and a feed-forward ANC circuit 323 as a noise cancellation circuit. The second signal processing circuit 320 may receive a first input signal input through the first microphone 210a, amplify the first input signal by the amplification circuit 321, and output the amplified signal to the synthesizer 330. The second signal processing circuit 320 may cancel noise from the first input signal by the feed-forward ANC circuit 323 and output the noise-canceled signal to the synthesizer 330.

According to an embodiment, the synthesizer 330 may synthesize a first frequency band signal output from the first signal processing circuit 310, a first input signal output from the second signal processing circuit 320, and a signal obtained by cancelling noise in the first input signal, and output a synthesized final output signal to the speaker 240.

According to an embodiment, the synthesizer 330 may synthesize the first frequency band signal output from the first signal processing circuit 310, the first input signal output from the second signal processing circuit 320, the signal obtained by cancelling noise in the first input signal, and a noise-cancelled signal from the feed-back ANC circuit 340, and output a synthesized final output signal to the speaker 240.

Figure 4:
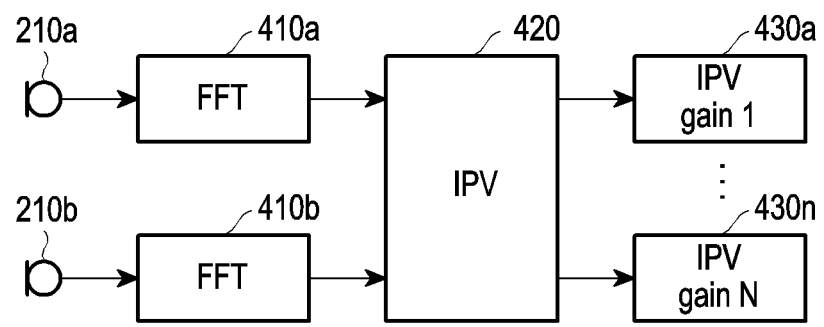
FIG. 4 is a block diagram illustrating a detailed configuration of an audio module in an electronic device for outputting a sound according to an embodiment.
Figure 5A:
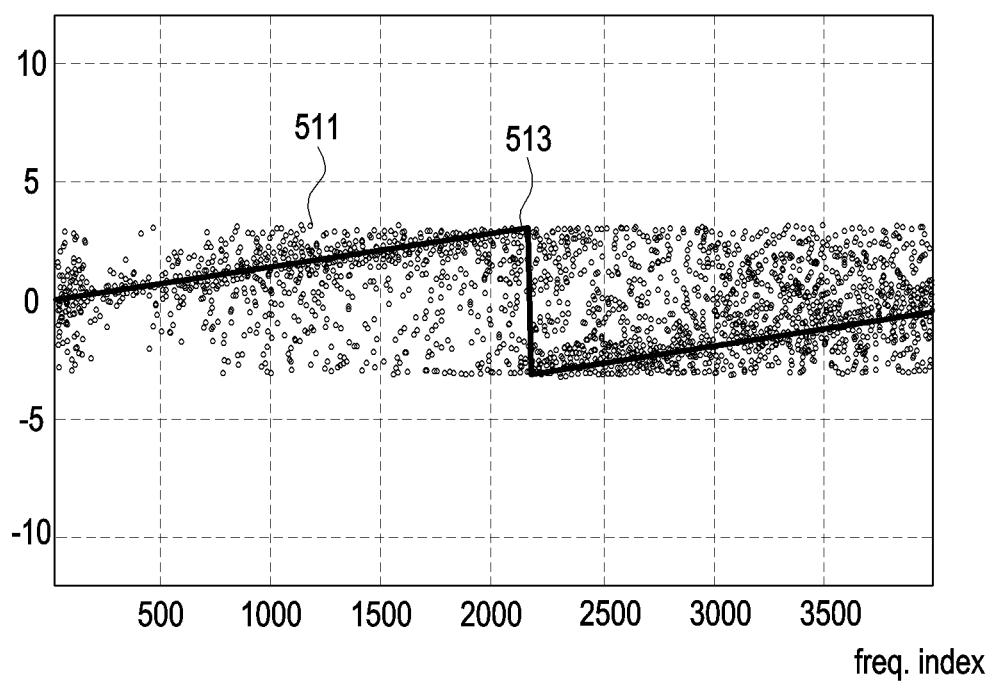
FIGS. 5A and 5B are graphs illustrating exemplary inter-channel phases in an electronic device for outputting a sound according to an embodiment.
Figure 5B:
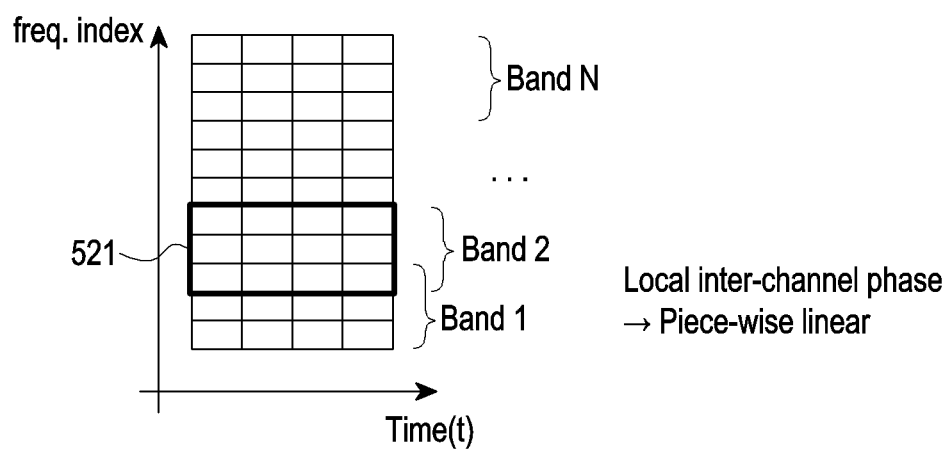

FIG. 4 is a block diagram illustrating a detailed configuration of an audio module in an electronic device for outputting a sound according to an embodiment. FIGS. 5A and 5B are graphs illustrating exemplary inter-channel phases in an electronic device for outputting a sound according to an embodiment.

Referring to FIGS. 3, 4, 5A, and 5B, according to an embodiment, the gain circuit 311 of the first signal processing circuit 310 may have an input terminal connected to the first microphone 210a and the second microphone 210b and an output terminal connected to the filtering circuit 313. The gain circuit 311 of the first signal processing circuit 310 may include fast Fourier transform (FFT) circuits 410a and 410b, an inter-channel phase variance (IPV) circuit 420, and circuits 430a, . . . , 430n for calculating a gain value on a frequency band-basis. The circuits 430a, . . . , 430n may be connected in parallel to the IPV circuit 420 in order to calculate a gain value for each of the separated frequency bands.

According to an embodiment, the gain circuit 311 may receive a first input signal through or from the first microphone 210a and receive a second input signal through or from the second microphone 210b. The gain circuit 311 may frequency-convert the first input signal, using the first FFT circuit 410a, and output the frequency-converted signal to the IPV circuit 420. The gain circuit 311 may frequency-convert the second input signal, using the second FFT circuit 410b, and output the frequency-converted signal to the IPV circuit 420. The gain circuit 311 may calculate an IPV using the IPV circuit 420. The gain circuit 311 may calculate a gain value based on an IPV in each of the circuits 430a, . . . , 430n for respective designated frequency bands (e.g., band 1, band 2, . . . , band N). Each of the circuits 430a, . . . , 430n may obtain a gain value inversely proportional to a phase variance value.

According to an embodiment, the input signals received from the microphones 210a and 210b, respectively in an environment with a sound source with a directionality and noise may be modeled as illustrated in FIG. 5A. In the graph of FIG. 5A, the x axis represents frequency indexes (e.g., FFT numbers), and the y-axis represents phases. As shown, the phases 511 of input signals including noise received from the microphones 210a and 210b, respectively, may be distributed around a graph 513 of ideal phases by the noise N.

For example, an input signal $X(\omega_k)$ of a first microphone X may be expressed as <Equation 1>, and an input signal $Y(\omega_k)$ of a second microphone Y may be expressed as <Equation 2>. Herein, the term S represents a target signal with a directionality, N represents noise, τ represents a relative delay (e.g., inter-channel phase) between the first microphone and the second microphone according to an incident direction of the target signal S.

$X(\omega_k) = S(\omega_k) + N_X(\omega_k)$  [Equation 1]

$Y(\omega_k) = S(\omega_k)e^{j\omega_k\tau} + N_Y(\omega_k)$  [Equation 2]

When the signal S with the directionality is input at a substantially constant τ value, a delay of the τ value may occur, resulting in a phase delay $e^{j\omega_k\tau}$ between the first microphone X and the second microphone Y. The occurrence of the delay of the τ value may be represented as changes (e.g., the slope of the graph 513 indicated by a solid line) in the phase value with respect to the increase of the frequency index in the graph 513 of ideal phases (noise-free phases), as illustrated in FIG. 5A. A phase variance may represent a distribution of the phases 511 of the received input signals around the graph 513 of ideal phases.

FIG. 5B illustrates a non-limiting example for obtaining gain values based on IPVs in separated frequency bands. In the graph of FIG. 5B, the x axis represents time t, and the y-axis represents frequency indexes. A gain value may be obtained based on an IPV, for each of a plurality of frequency bands (e.g., band 1, band 2, . . . , band N) which are separated by frequency-converting input signals. For example, as illustrated in FIG. 5B, a piece-wise linear characteristic may be assumed for a local inter-channel phase in a local region 521 designated for obtaining a gain value. The phase variance (or change) may be inversely proportional to the probability that a signal with a directionality is present. For example, in the one local region 521, a signal with a directionality has a specific value related to τ and thus may have a small phase variance value (or a constant value), whereas a noise signal may have a large phase variance value.

According to an embodiment, the gain circuit 311 may calculate a gain value $\eta_k(\omega)$ based on an IPV by <Equation 3> below. Herein, θ may represent a phase variance, and γ may represent a gain curve control factor (e.g., a weight control factor). A γ value, which is a weighting value for an IPV, may determine a curve of a mapping function between the IPV and the gain value. τ may represent a relative delay (e.g., IPV) between the first microphone and the second microphone according to the incident direction of the target signal S.

$$\eta_k(\omega) = \frac{1}{1 + \gamma\theta_{\tau,k}^2(\omega)}$$ [Equation 3]

According to an embodiment, when the IPV is less than equal to a first reference value, the gain circuit 311 may obtain a first value (e.g., a value close to 1) as the gain value of a frequency band signal as a frequency band signal with a directionality. The gain circuit 311 may output a gain value for each of the frequency bands obtained in the respective circuits 430a, . . . , 430n to the filtering circuit 313. When the IPV is greater than or equal to a second reference value, the gain circuit 311 may obtain a second value (e.g., a value close to 0) as the gain value of a frequency band signal as simple background noise without a directionality. The gain value is a value multiplied by the frequency band signal, and may be inversely proportional to the phase variance of the frequency band signal.

Figure 6:
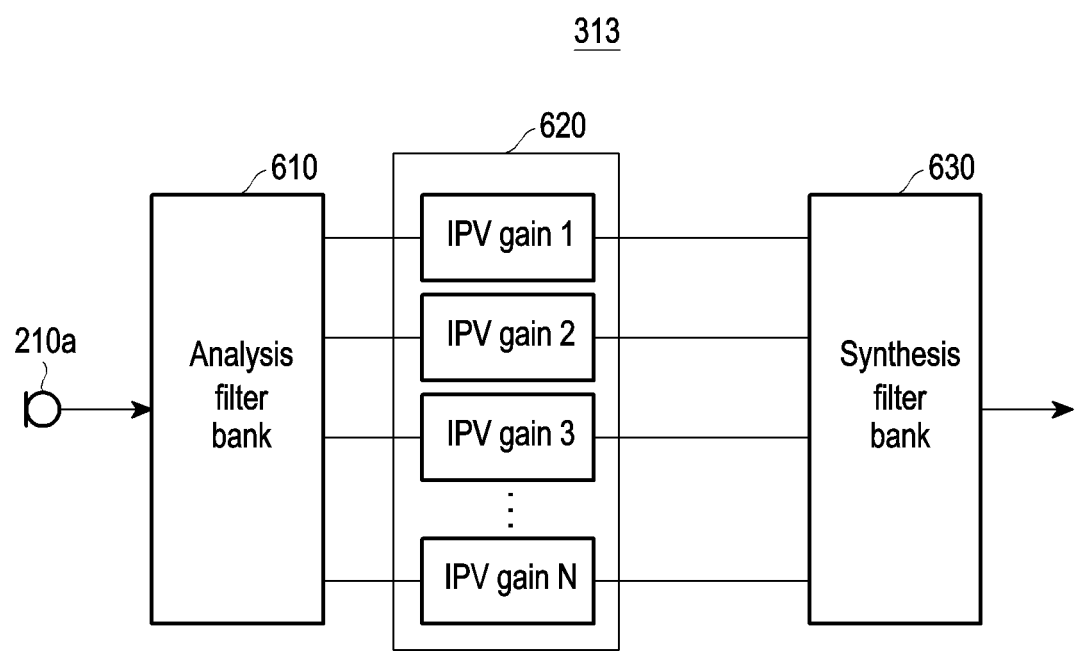
FIG. 6 is a block diagram illustrating a detailed configuration of an audio module in an electronic device for outputting a sound according to an embodiment.

FIG. 6 is a block diagram illustrating a detailed configuration of an audio module in an electronic device for outputting a sound according to an embodiment.

Referring to FIGS. 3 and 6, according to an embodiment, the filtering circuit 313 of the first signal processing circuit 310 may have an input terminal connected to the first microphone 210a and an output terminal connected to the synthesizer 330 or the noise cancellation circuit 315 connected to the synthesizer 330. The filtering circuit 313 of the first signal processing circuit 310 may include an analysis filter bank 610 (e.g., FFT), a plurality of filters 620 (e.g., IPV gain 1, IPV gain 2, IPV gain 3, . . . , IPV gain N), and a synthesis filter bank 630. The plurality of filters 620 may be connected in parallel between the analysis filter bank 610 and the synthesis filter bank 630, and filter the frequency bands separated by frequency conversion of the first input signal input through the first microphone. The plurality of filters 620 may be bandpass filters corresponding respectively to frequency bands separated based on the frequency band of a voice signal.

According to an embodiment, the filtering circuit 313 may frequency-convert the first input signal received from the first microphone 210a and process the frequency-converted signal as a sequence signal into frequency bands in parallel by the analysis filter bank 610. The analysis filter bank 610 may convert the first input signal into frequency components and separate the frequency components into the frequency bands by a plurality of bandpass filters based on the frequency band of the voice signal. The frequency bands may be appropriately divided according to human hearing standards such as an equal or mel-filter bank according to a use scenario. Here, the mel-filter bank may obtain a mel value (e.g., mel-spectrogram) by applying mel-filters to frequencies obtained for each frame divided from an input signal.

According to an embodiment, the filtering circuit 313 may perform multi-band filtering in parallel for the respective frequency bands based on the gain values of the frequency bands received from the gain circuit 311 by the plurality of filters 620. The filtering circuit 313 may filter a signal of a frequency band having a first gain value (e.g., a value close to 1) among the plurality of frequency bands as a first frequency band signal with a directionality and allow the first frequency band signal to bypass, by using the plurality of filters 620. The filtering circuit 313 of the first signal processing circuit 310 may filter a signal of a frequency band having a second gain value (e.g., a value close to zero) among the plurality of frequency bands as a second frequency band signal without a directionality and block (or remove) the second frequency band signal. The first signal processing circuit 310 may cancel noise from a frequency band signal (e.g., the first frequency band signal) output from the filtering circuit 313 by the noise cancellation circuit 315.

According to an embodiment, the filtering circuit 313 of the first signal processing circuit 310 may synthesize frequency band signals filtered on a frequency band basis and thus output a desired frequency band signal (e.g. the first frequency band signal with a directionality) to the synthesizer 330, by the synthesis filter bank 630.

Referring again to FIG. 3, according to an embodiment, the amplification circuit (e.g., PSAP) 321 of the audio module 230 may be an amplifier that amplifies the first input signal received from the first microphone 210a, and is arranged between the first microphone 210a and the synthesizer 330. The amplification circuit 321 may amplify the first input signal input from the first microphone 210a and output the amplified signal to the synthesizer 330.

According to an embodiment, the feed-forward ANC circuit 323 as a noise cancellation circuit may be configured between the first microphone 210a and the synthesizer 330, cancel noise from the first input signal input from the microphone 210a, and output the noise-canceled signal to the synthesizer 330, so that the sound and voice of audio content may be heard.

According to an embodiment, the synthesizer 330 of the audio module 230 may synthesize the first frequency band signal which is a filtered signal output from the first signal processing circuit 310, the amplified first input signal output from the amplifier circuit 321, and the signal obtained by canceling noise in the first input signal output from the feed-forward ANC circuit 323, and output the synthesized signal as a final output signal to the speaker 240. According to an embodiment, the synthesizer 330 may synthesize the first frequency band signal output from the first signal processing circuit 310, the amplified first input signal output from the second signal processing circuit 320, the signal obtained by canceling noise in the first input signal, and the noise-canceled signal from the feed-back ANC circuit 340, and output the synthesized signal as a final output signal to the speaker 240.

According to an embodiment, the audio module 230 may calculate a final gain value by multiplying a gain value (IPVgain or A*IPVgain) obtained using an IPV (or a variance) by a gain value (IMVgain or (1−A)*IMVgain) obtained using an inter-channel magnitude variation by <Equation 4> or <Equation 5>. In <Equation 5>, A represents an average value of gains.

$$\text{final gain} = \text{IPVgain} * \text{IMVgain} \qquad \text{[Equation 4]}$$

$$\text{final gain} = A * \text{IPVgain} + (1-A) * \text{IMVgain} \qquad \text{[Equation 5]}$$

While main components of an electronic device have been described above in the context of the electronic device 201 in an embodiment, all of the components of the electronic device 201 illustrated in FIG. 2B are not essential components in an embodiment, and the electronic device 201 may be implemented with more or fewer components than the illustrated components. Further, the positions of the main components of the electronic device 201 described above with reference to FIG. 2B may vary according to an embodiment.

According to an embodiment, an electronic device (e.g., the electronic device 201 of FIGS. 2A and 2B) may include a plurality of microphones (e.g., the microphones 210 of FIGS. 2A and 2B or the microphones 210a and 210b of FIG. 3), a speaker (e.g., the speaker 240 of FIGS. 2B and 3), an audio module (e.g., the audio module 230 of FIGS. 2B and 3), and a processor (e.g., the processor 220 of FIG. 2B) electrically coupled to the plurality of microphones, the speaker, and the audio module. The processor may be configured to control the audio module to separate each of input signals of ambient sounds input respectively through the plurality of microphones into a plurality of frequency bands by frequency conversion, control the audio module to obtain a gain value for each of the plurality of frequency bands based on an inter-channel phase variance for the plurality of frequency bands, control the audio module to filter a first frequency band signal with a directionality based on the gain value for each of the plurality of frequency bands, and control the speaker to output an output signal processed based on the first frequency band signal.

According to an embodiment, the at least one processor may be configured to control the audio module to obtain the output signal by synthesizing the first frequency band signal and a signal obtained by amplifying a first input signal input to a first microphone among the plurality of microphones, and the first frequency band signal may correspond to an ambient sound to be output in real time, in a state in which ambient sound blocking is set to output a sound of an external electronic device (e.g., the electronic device 101, 102, or 104 of FIG. 1 or the electronic device 202 of FIG. 2A).

According to an embodiment, the at least one processor may be configured to control the audio module to identify the inter-channel phase variance for the plurality of frequency bands, when a value of the inter-channel phase variance is less than or equal to a first reference value, control the audio module to obtain a first value as the gain value, and when the value of the inter-channel phase variance is greater than or equal to a second reference value, control the audio module to obtain a second value as the gain value.

According to an embodiment, the at least one processor may be configured to control the audio module to identify a signal of a frequency band having the first value as the gain value among the plurality of frequency bands as the first frequency band signal and allow the first frequency band signal to bypass, and the first value may be a value close to 1.

According to an embodiment, the at least one processor may be configured to control the audio module to identify a signal of a frequency band having the second value as the gain value among the plurality of frequency bands as a second frequency band signal without a directionality and block the second frequency band signal, and the second value may be a value close to 0.

According to an embodiment, the audio module may include a first signal processing circuit (e.g., the first signal processing circuit 310 of FIG. 3) including a gain circuit (e.g., the gain circuit 311 of FIGS. 3 and 4) configured to identify the inter-channel phase variance in each of the plurality of frequency bands and obtain the gain value for each of the plurality of frequency bands based on the inter-channel phase variance, and a filtering circuit (e.g., the filtering circuit 313 of FIGS. 3 and 6) configured to filter the first frequency band signal based on the gain value for each of the plurality of frequency bands, a second signal processing circuit (e.g., the second signal processing circuit 320 of FIG. 3) configured to amplify a first input signal received through a first microphone among the plurality of microphones, and a synthesizer (e.g., the synthesizer 330) configured to synthesize the first frequency band signal output from the first signal processing circuit and a signal output from the second signal processing circuit, and output the output signal to the speaker.

According to an embodiment, the first signal processing circuit may further include a noise cancellation circuit (e.g., the noise cancellation circuit 315 of FIG. 3) configured to cancel noise in the first frequency band signal allowed to bypass among signals of filtered frequency bands.

According to an embodiment, the filtering circuit may include a plurality of filters (e.g., the filters 620 of FIG. 6) configured to respectively filter the plurality of frequency bands separated by frequency conversion of the first input signal input through the first microphone (e.g., the first microphone 210a of FIG. 3) among the plurality of microphones.

According to an embodiment, the second signal processing circuit may include an amplification circuit configured to amplify the first input signal received through the first microphone and output the amplified signal to the synthesizer, and a noise cancellation circuit configured to cancel noise in the first input signal and output a noise-canceled signal to the synthesizer.

According to an embodiment, the at least one processor may be configured to control the audio module to obtain a gain value based on a signal magnitude variance for each of the plurality of frequency bands, and control the audio module to filter the first frequency band signal, using at least one of the gain value obtained based on the inter-channel phase variance or the gain value based on the signal magnitude variance.

Figure 7:
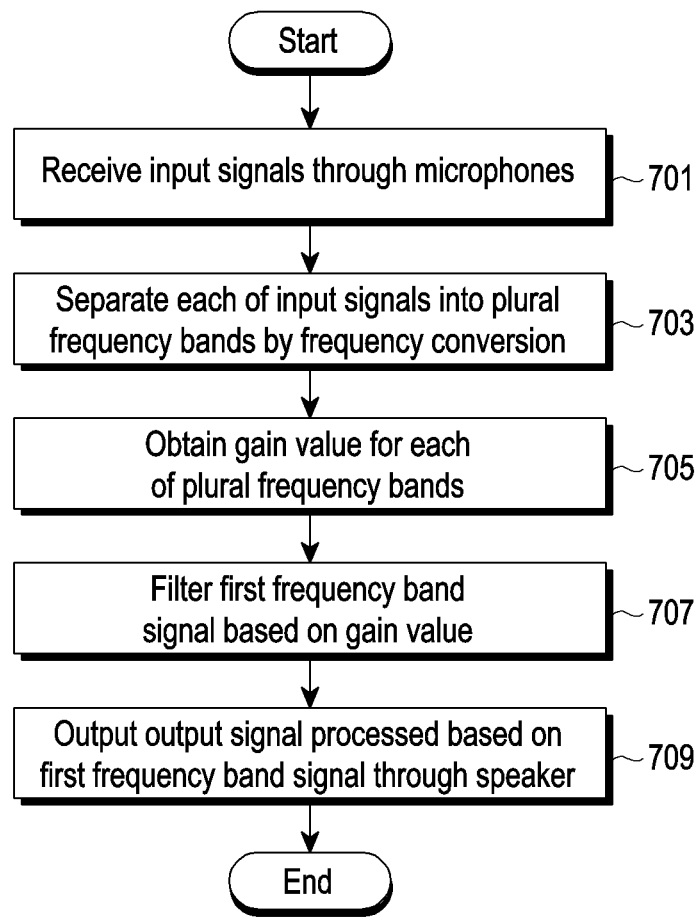
FIG. 7 is a flowchart illustrating an exemplary method of operating an electronic device for outputting a sound according to an embodiment.

FIG. 7 is a flowchart illustrating an exemplary method of operating an electronic device for outputting a sound according to an embodiment, and FIGS. 8A to 8E are graphs illustrating exemplary signal processing in an electronic device for outputting a sound according to an embodiment.

According to an embodiment, operations 701 to 709 may be understood to be performed by a processor (e.g., the processor 220 of FIGS. 2B) of an electronic device (e.g., the electronic device 201 of FIGS. 2A and 2B). The processor may be arranged in communication and/or connection with one or more other components of the electronic device, such as shown and described above, and variations thereon.

Figure 8A:
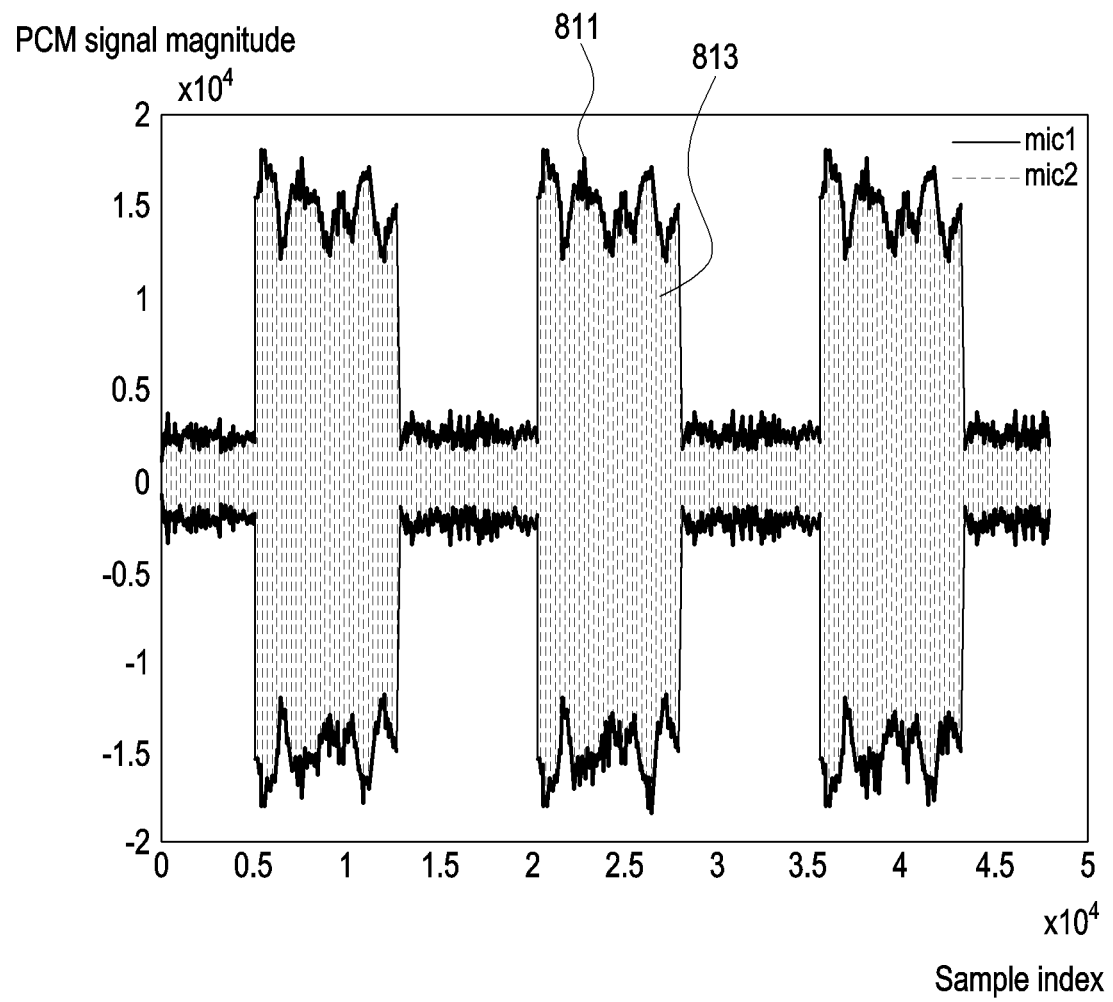
FIGS. 8A to 8E are graphs illustrating exemplary signal processing in an electronic device for outputting a sound according to an embodiment.

Referring to FIG. 7, in operation 701, the electronic device (e.g., the electronic device 201 of FIGS. 2A and 2B) according to an embodiment may receive a first input signal through a first microphone (the first microphone 210a of FIG. 3), and a second input signal through a second microphone (e.g., the second microphone 210b of FIG. 3). As shown in FIG. 8A, a first input signal 811 (e.g., a solid line for mid or first microphone 210a) received through a first microphone mic1 and a second input signal 813 (e.g., a dotted line for mic2 or second microphone 210b) received through a second microphone mic2 are represented. In the graph of FIG. 8A, the x axis represents sample indexes, and the y axis represents magnitudes of a pulse code modulation (PCM) signal (e.g., a 16-bit PCM signal) of an input signal input through a microphone.

Figure 8B:
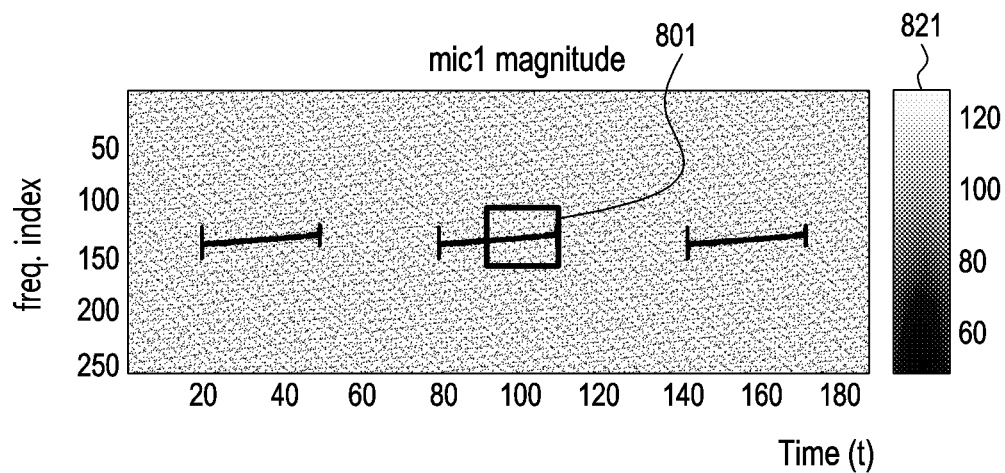
Figure 8C:
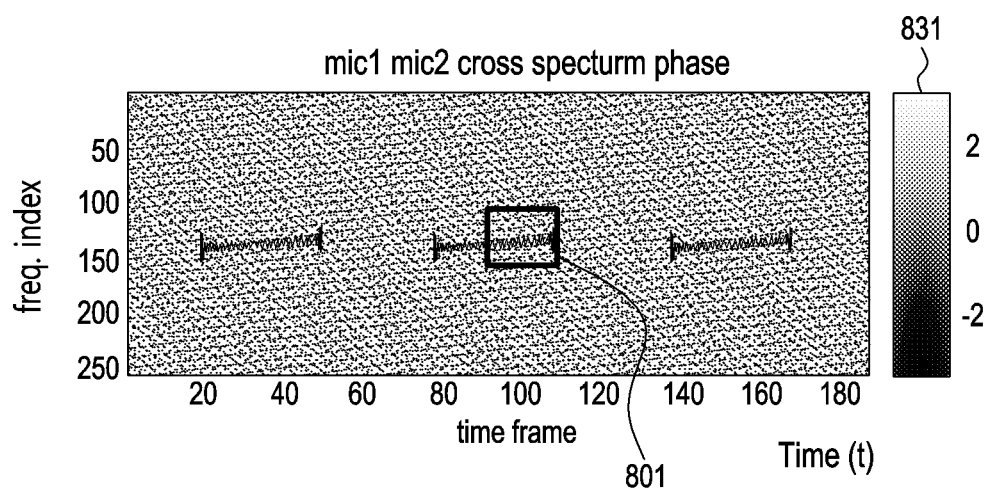

In operation 703, the electronic device may separate each of the first input signal and the second input signal into a plurality of frequency bands by frequency conversion. Further, the electronic device may identify an IPV in each of the separated frequency bands by an audio signal processing circuit (e.g., the audio signal processing circuit 301 of FIG. 3) of an audio module (e.g., the audio module 230 of FIGS. 2B and 3) of the electronic device. The electronic device may identify the signal magnitudes of the frequency bands separated by frequency conversion of the first input signal by the audio signal processing circuit of the audio module. FIG. 8B illustrates the magnitude (e.g., mic1 magnitude) of the first input signal in a specific frequency band according to time t (or time frame). Magnitudes of the PCM signal of the first microphone may be represented as values distinguished by contrast (or colors) as illustrated in a graph 821. Cross spectrum phases (e.g., mic1 mic2 cross spectrum phase) of the first input signal and the second input signal may be represented as phases in a specific frequency band according to time t (or time frame), as illustrated in FIG. 8C. The cross spectrum phases of the first microphone and the second microphone may be expressed as values distinguished by contrast (or colors), as illustrated in a graph 831. In FIGS. 8B and 8C, the x axis represents time t (or time frame), and the y axis represents frequency indexes indicating frequency bands. In the graphs of FIGS. 8B and 8C, a designated region 801 (e.g., the local region 521 of FIG. 5B) is a region indicating a specific frequency band (e.g., a frequency band corresponding to frequency indexes of about 135 to 140) for obtaining a gain value.

Figure 8D:
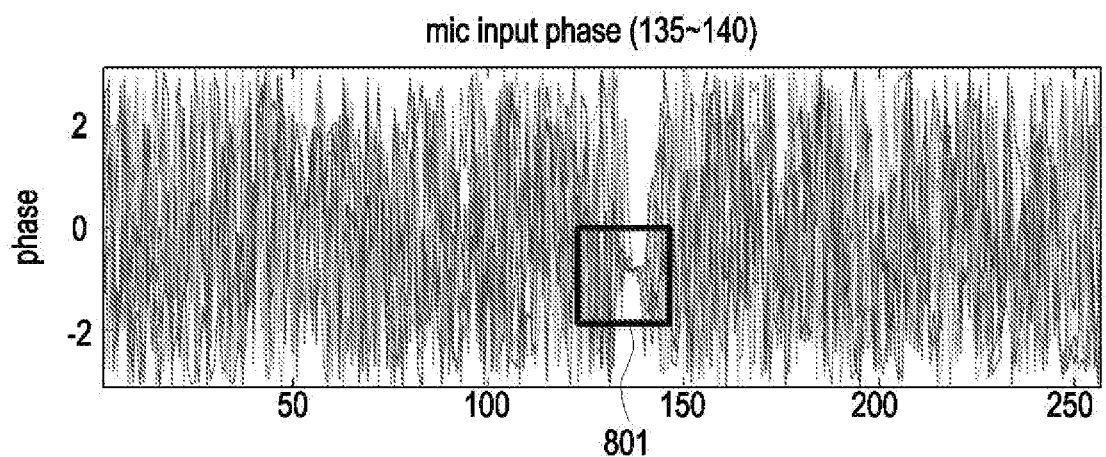
Figure 8E:
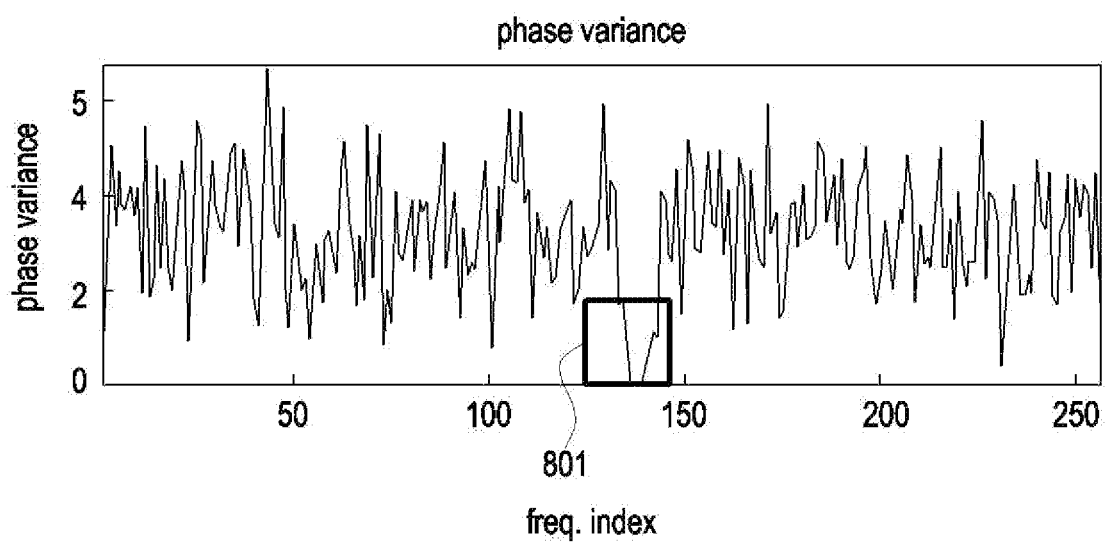

In operation 705, the electronic device may obtain a gain value for each of the plurality of frequency bands based on the IPV identified in the frequency band by the audio signal processing circuit of the audio module. When the IPV is less than or equal to a first reference value, the electronic device may obtain a first value (e.g., a value close to 1) as the gain value. When the IPV is greater than or equal to a second reference value, the electronic device may obtain a second value (e.g., a value close to 0) as the gain value. The electronic device may obtain the gain values for the plurality of respective separated frequency bands based on at least one of the IPVs or the signal magnitudes of the frequency bands. As illustrated in FIG. 8D, the electronic device may identify phases less than or equal to the first reference value in the specific frequency band 801 (e.g., the frequency band corresponding to the frequency indexes of about 135 to 140) within the designated region on a mic input phase graph. As illustrated in FIG. 8E, as the electronic device identifies phase variances as small values less than or equal to the first reference value in the specific frequency band 801 (e.g., about 135 to 140) on a phase variance graph, the electronic device may identify the signal of the specific frequency band 801 as a first frequency band signal with a directionality. In FIG. 8D, the x axis represents frequency indexes, and the y axis represents phases. In FIG. 8E, the x axis represents frequency indexes, and the y axis represents phase variances.

In operation 707, the electronic device may perform a multi-band filtering operation for frequency band signals corresponding respectively to plurality of frequency bands in parallel based on the gain values for the plurality of frequency bands by the audio signal processing circuit of the audio module. The electronic device may filter first frequency band signal with a directionality based on the gain values for the plurality of frequency bands and allow the filtered first frequency band signal to bypass through the multi-band filtering by the audio signal processing circuit of the audio module. The electronic device may identify a signal of a frequency band having the first value (e.g., a value close to 1) as its gain value among the plurality of frequency bands as a first frequency band signal with a directionality, and output the first frequency band signal to a synthesizer (e.g., the synthesizer 330 of FIG. 3) by allowing the first frequency band signal to bypass. The electronic device may identify a signal of a frequency band having the second value (e.g., a value close to 0) as its gain value among the plurality of frequency bands as a second frequency band signal without a directionality, and block (or remove) the second frequency band signal. The first frequency band signal allowed to bypass may be a frequency band signal corresponding to an ambient sound to be output in real time in a state in which ambient sound blocking is set to output a sound of the external electronic device.

In operation 709, the electronic device may transmit an output signal processed based on the filtered frequency band signals (e.g., the first frequency band signals with a directionality) through a speaker (e.g., the speaker 240 of FIGS. 2B and 3) by the audio signal processing circuit of the audio module. The electronic device may obtain the output signal by synthesizing the first frequency band signals and the first input signal input to the first microphone among the plurality of microphones, and output the obtained output signal through the speaker. The output signal may be an ambient sound such as an alarm sound generated in an external environment, a sound calling a user, or an announcement, and output to be heard by the user in real time.

According to an embodiment, a method of operating an electronic device (e.g., the electronic device 201 of FIGS. 2A and 2b) may include receiving input signals of ambient sounds input respectively through a plurality of microphones (e.g., the microphones 210 of FIGS. 2A and 2B or the microphones 210a and 210b of FIG. 3) of the electronic device, separating each of the input signals into a plurality of frequency bands by frequency conversion by an audio module (e.g., the audio module 230 of FIGS. 2B and 3) of the electronic device, obtaining a gain value for each of the plurality of frequency bands based on an inter-channel phase variance for the plurality of frequency bands by the audio module, filtering a first frequency band signal with a directionality based on the gain value for each of the plurality of frequency bands by the audio module, and outputting an output signal processed based on the first frequency band signal through a speaker (e.g., the speaker 240 of FIGS. 2B and 3) of the electronic device.

According to an embodiment, the method may further include obtaining the output signal by synthesizing the first frequency band signal and a signal obtained by amplifying a first input signal input to a first microphone (e.g., the first microphone 210a of FIG. 3) among the plurality of microphones, and the first frequency band signal may corresponds to an ambient sound to be output in real time, in a state in which ambient sound blocking is set to output a sound of an external electronic device (e.g., the electronic device 101, 102, or 104 of FIG. 1 or the external electronic device 202 of FIG. 2A).

According to an embodiment, obtaining the gain value for each of the plurality of frequency bands may include identifying the inter-channel phase variance for the plurality of frequency bands, when a value of the inter-channel phase variance is less than or equal to a first reference value, obtaining a first value as the gain value, and when the value of the inter-channel phase variance is greater than or equal to a second reference value, obtaining a second value as the gain value. As described above, an inter-channel phase variance is small when the inter-channel phase variance value is less than or equal to a first reference value in a specific frequency band and is large when the inter-channel phase variance value is greater than the first reference value in the specific frequency band, or larger than a second reference value.

According to an embodiment, filtering the first frequency band signal may include identifying a signal of a frequency band having the first value as the gain value among the plurality of frequency bands as the first frequency band signal, and allowing the first frequency band signal to bypass, and the first value may be a value close to 1.

According to an embodiment, filtering the first frequency band signal may include identifying a signal of a frequency band having the second value as the gain value among the plurality of frequency bands as a second frequency band signal without a directionality, and blocking the second frequency band signal, and the second value may be a value close to 0.

According to an embodiment, separating each of the input signals into the plurality of frequency bands by frequency conversion may include separating a first input signal input from a first microphone (e.g., the first microphone 210a of FIG. 3) among the plurality of microphones into the plurality of frequency bands by frequency conversion, separating a second input signal input from a second microphone (e.g., the second microphone 210b of FIG. 3) among the plurality of microphones into the plurality of frequency bands by frequency conversion, and identifying the inter-channel phase variance in each of the plurality of frequency bands.

According to an embodiment, the method may further include cancelling noise in the first frequency band signal by the audio module of the electronic device.

According to an embodiment, the method may further include amplifying the first input signal received through the first microphone by the audio module, canceling noise in the first input signal by the audio module, and obtaining an output signal by synthesizing the first frequency band signal, a signal obtained by amplifying the first input signal, and a signal obtained by canceling noise in the first input signal by the audio module.

According to an embodiment, filtering the first frequency band signal may include obtaining a gain value based on a signal magnitude variance for each of the plurality of frequency bands by the audio module, and filtering the first frequency band signal, using at least one of the gain value obtained based on the inter-channel phase variance or the gain value based on the signal magnitude variance by the audio module.

According to an embodiment, in a non-transitory storage medium storing a program, the program may include executable instructions which when executed by a processor of an electronic device, cause the electronic device to receive input signals of ambient sounds input respectively through a plurality of microphones of the electronic device, separate each of the input signals into a plurality of frequency bands by frequency conversion by an audio module of the electronic device, obtain a gain value for each of the plurality of frequency bands based on an inter-channel phase variance for the plurality of frequency bands by the audio module, filter the first frequency band signal based on the gain value for each of the plurality of frequency bands by the audio module, and output an output signal processed based on the first frequency band signal through a speaker of the electronic device.

The embodiments of the disclosure are provided to describe and help understanding of the disclosure technical content, not limiting the technical scope of the disclosure. Accordingly, the scope of the disclosure should be interpreted as encompassing all modifications or various other embodiments based on the technical spirit of the disclosure.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "$1^{st}$" and "$2^{nd}$", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term 'non-transitory' simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
a plurality of microphones;
a speaker; an audio module;
at least one processor comprising processing circuitry; and
memory storing executable instructions,
wherein the instructions, when executed by the at least one processor, cause the electronic device to:
control the audio module to separate each of input signals of ambient sounds input respectively through the plurality of microphones into a plurality of frequency bands by frequency conversion,
control the audio module to obtain a gain value for each of the plurality of frequency bands based on an inter-channel phase variance for the plurality of frequency bands,
control the audio module to filter a first frequency band signal with a directionality based on the gain value for each of the plurality of frequency bands,
control the audio module to synthesize the filtered first frequency band signal and a signal obtained by amplifying a first input signal input to a first microphone among the plurality of microphones, and
control the speaker to output an output signal obtained based on synthesizing the filtered first frequency band signal and the amplified first input signal.

2. The electronic device of claim 1,
wherein the first frequency band signal corresponds to an ambient sound to be output in real time, in a state in which an ambient sound blocking is set to output a sound of an external electronic device.

3. The electronic device of claim 1, wherein the instructions, when executed by the at least one processor, cause the electronic device to:
control the audio module to identify the inter-channel phase variance for the plurality of frequency bands,
in response to a value of the inter-channel phase variance being less than or equal to a first reference value, control the audio module to obtain a first value as the gain value, and
in response to the value of the inter-channel phase variance being greater than or equal to a second reference value, control the audio module to obtain a second value as the gain value.

4. The electronic device of claim 3, wherein the instructions, when executed by the at least one processor, cause the electronic device to control the audio module to identify a signal of a frequency band having the first value as the gain value among the plurality of frequency bands as the first frequency band signal and allow the first frequency band signal to bypass, and
wherein the first value is a value close to 1.

5. The electronic device of claim 3, wherein the instructions, when executed by the at least one processor, cause the electronic device to control the audio module to identify a signal of a frequency band having the second value as the gain value among the plurality of frequency bands as a second frequency band signal without a directionality and block the second frequency band signal, and
wherein the second value is a value close to 0.

6. The electronic device of claim 1, wherein the audio module comprises: a first signal processing circuit including a gain circuit configured to identify the inter-channel phase variance in each of the plurality of frequency bands and obtain the gain value for each of the plurality of frequency bands based on the inter-channel phase variance, and a filtering circuit configured to perform the filtering of filter the first frequency band signal based on the gain value for each of the plurality of frequency bands;
a second signal processing circuit configured to perform the amplification of amplify the first input signal; and
a synthesizer configured to perform the synthesizing of synthesize the filtered first frequency band signal output from the first signal processing circuit and the amplified first input a signal output from the second signal processing circuit, and output the output signal to the speaker.

7. The electronic device of claim 6, wherein the first signal processing circuit further comprises a noise cancellation circuit configured to cancel noise in the first frequency band signal allowed to bypass among signals of filtered frequency bands.

8. The electronic device of claim 6, wherein the filtering circuit comprises a plurality of filters configured to respectively filter the plurality of frequency bands separated by frequency conversion of the first input signal.

9. The electronic device of claim 6, wherein the second signal processing circuit comprises:
an amplification circuit configured to perform the amplification of amplify the first input signal and output the amplified first input signal to the synthesizer; and
a noise cancellation circuit configured to cancel noise in the first input signal and output a noise-canceled signal to the synthesizer;
wherein the output signal is obtained based on synthesizing the filtered first frequency band signal, the amplified first input signal, and the noise-canceled signal.

10. The electronic device of claim 1, wherein the instructions, when executed by the at least one processor, cause the electronic device to:
control the audio module to obtain a gain value based on a signal magnitude variance for each of the plurality of frequency bands, and control the audio module to perform the filtering of filter the first frequency band signal, using at least one of the gain value obtained based on the inter-channel phase variance or the gain value based on the signal magnitude variance.

11. A method of operating an electronic device, the method comprising:
receiving input signals of ambient sounds input respectively through a plurality of microphones of the electronic device;
separating each of the input signals into a plurality of frequency bands by frequency conversion by an audio module of the electronic device;
obtaining a gain value for each of the plurality of frequency bands based on an inter-channel phase variance for the plurality of frequency bands by the audio module;
filtering a first frequency band signal with a directionality based on the gain value for each of the plurality of frequency bands by the audio module;
synthesizing the filtered first frequency band signal and a signal obtained by amplifying a first input signal input to a first microphone among the plurality of microphones; and
outputting, through a speaker of the electronic device, an output signal obtained based on synthesizing the filtered first frequency band and the amplified first input signal.

12. The method of claim 11,
wherein the first frequency band signal corresponds to an ambient sound to be output in real time, in a state in which an ambient sound blocking is set to output a sound of an external electronic device.

13. The method of claim 11, wherein obtaining the gain value for each of the plurality of frequency bands comprises:
    identifying the inter-channel phase variance for the plurality of frequency bands;
    in response to a value of the inter-channel phase variance being less than or equal to a first reference value, obtaining a first value as the gain value; and
    in response to the value of the inter-channel phase variance being greater than or equal to a second reference value, obtaining a second value as the gain value.

14. The method of claim 13, wherein filtering the first frequency band signal comprises:
    identifying a signal of a frequency band having the first value as the gain value among the plurality of frequency bands as the first frequency band signal; and
    allowing the first frequency band signal to bypass, and wherein the first value is a value close to 1.

15. The method of claim 13, wherein filtering the first frequency band signal comprises:
    identifying a signal of a frequency band having the second value as the gain value among the plurality of frequency bands as a second frequency band signal without a directionality; and
    blocking the second frequency band signal, and wherein the second value is a value close to 0.

16. The method of claim 11, wherein separating each of the input signals into the plurality of frequency bands by frequency conversion comprises:
    separating the first input signal into the plurality of frequency bands by frequency conversion;
    separating a second input signal input from a second microphone among the plurality of microphones into the plurality of frequency bands by frequency conversion; and
    identifying the inter-channel phase variance in each of the plurality of frequency bands.

17. The method of claim 16, further comprising:
    amplifying the first input signal;
    canceling noise in the first input signal by the audio module; and
    obtaining the output signal by synthesizing the filtered first frequency band signal, the signal obtained by amplifying the amplified first input signal, and a signal obtained by canceling noise in the first input signal by the audio module.

18. The method of claim 11, further comprising cancelling noise in the first frequency band signal by the audio module of the electronic device.

19. The method of claim 11, wherein filtering the first frequency band signal comprises:
    obtaining a gain value based on a signal magnitude variance for each of the plurality of frequency bands by the audio module; and
    filtering the first frequency band signal, using at least one of the gain value obtained based on the inter-channel phase variance or the gain value based on the signal magnitude variance by the audio module.

20. A non-transitory storage medium storing a program including executable instructions which when executed by a processor of an electronic device, cause the electronic device to:
    receive input signals of ambient sounds input respectively through a plurality of microphones of the electronic device;
    separate each of the input signals into a plurality of frequency bands by frequency conversion by an audio module of the electronic device;
    obtain a gain value for each of the plurality of frequency bands based on an inter-channel phase variance for the plurality of frequency bands by the audio module;
    filter a first frequency band signal with a directionality based on the gain value for each of the plurality of frequency bands by the audio module;
    synthesize the filtered first frequency band signal and a signal obtained by amplifying a first input signal input to a first microphone among the plurality of microphones; and
    output, through a speaker of the electronic device, an output signal obtained based on synthesizing the filtered first frequency band signal and the amplified first input signal.

* * * * *